United States Patent
Iida et al.

(10) Patent No.: US 8,308,864 B2
(45) Date of Patent: Nov. 13, 2012

(54) SINGLE-CRYSTAL MANUFACTURING METHOD

(75) Inventors: Makoto Iida, Nishishirakawa (JP); Kazuo Matsuzawa, Nishishirakawa (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 13/143,859

(22) PCT Filed: Nov. 27, 2009

(86) PCT No.: PCT/JP2009/006416
§ 371 (c)(1),
(2), (4) Date: Jul. 8, 2011

(87) PCT Pub. No.: WO2010/103594
PCT Pub. Date: Sep. 16, 2010

(65) Prior Publication Data
US 2011/0271898 A1 Nov. 10, 2011

(30) Foreign Application Priority Data
Mar. 11, 2009 (JP) .................................. 2009-058325

(51) Int. Cl.
*C30B 15/00* (2006.01)
(52) U.S. Cl. ................. 117/35; 117/11; 117/13; 117/30; 117/32
(58) Field of Classification Search ...................... 117/11, 117/13, 30, 32, 35
See application file for complete search history.

(56) References Cited

U.S. PATENT DOCUMENTS

| | | | |
|---|---|---|---|
| 5,476,064 A * | 12/1995 | Sasaki et al. | 117/15 |
| 5,477,805 A * | 12/1995 | Izunome et al. | 117/13 |
| 2005/0022722 A1* | 2/2005 | Takanashi et al. | 117/13 |
| 2005/0160966 A1* | 7/2005 | Fusegawa et al. | 117/13 |
| 2007/0158653 A1 | 7/2007 | Iida et al. | |

FOREIGN PATENT DOCUMENTS

| | | |
|---|---|---|
| JP | A-6-279172 | 10/1994 |
| JP | A-7-25695 | 1/1995 |
| JP | A-2002-12494 | 1/2002 |
| JP | A-2002-326888 | 11/2002 |
| JP | A-2004-175620 | 6/2004 |
| JP | A-2004-262723 | 9/2004 |
| JP | A-2008-247737 | 10/2008 |

OTHER PUBLICATIONS

International Search Report dated Feb. 16, 2010 in International Application No. PCT/JP2009/006416.

* cited by examiner

*Primary Examiner* — Matthew Song
(74) *Attorney, Agent, or Firm* — Oliff & Berridge, PLC

(57) ABSTRACT

The present invention is a single-crystal manufacturing method based on the Czochralski method, comprising at least the steps of: producing a melt by heating and melting a crystalline raw material in a crucible with a heater; maturing the melt by keeping the melt at a high temperature; growing a single crystal after dipping a seed crystal into the matured melt, wherein the heater and the crucible are relatively moved up and down in the step of maturing. As a result, there is provided a single-crystal manufacturing method that enables the generation of dislocation to be effectively suppressed and a high quality single crystal to be manufactured at good yield, particularly in case of pulling the single crystal having a large diameter, in manufacture of the single crystal.

12 Claims, 2 Drawing Sheets

SINGLE-CRYSTAL MANUFACTURING METHOD

TECHNICAL FIELD

The present invention relates to a single-crystal manufacturing method based on the Czochralski method (hereinafter, referred to as the CZ method) particularly with a crucible having a large diameter.

BACKGROUND ART

In recent years, the integration and precision of semiconductor devices have become increasingly higher, and the diameter of a wafer to be used has become steadily larger, and demand for the wafer having a large diameter of particularly 150 mm, 200 mm, and 300 mm or more has been increased.

Incidentally, there has been a problem that dislocation is easy to be generated during growing a large diameter crystal by the CZ method, since the growth of the crystal having a diameter of 150 mm or more was started. Particularly, in case of manufacturing a large diameter crystal doped with nitrogen or a large diameter crystal having a low resistivity, the generation of dislocation is significantly increased.

After the steps of melting a crystalline raw material charged in a crucible and of decreasing the temperature of a melt so as to be an appropriate status of the melt for the start of crystal manufacture are performed, the crystal manufacture can be started. Conventionally, it is attempted to start the crystal manufacture as soon as possible by shortening the time required for the above-described steps in order to shorten the time required for the whole manufacture including the melting, decrease in temperature, and crystal manufacture.

With a larger diameter of a single crystal, however, productivity for conditions of growing the single crystal having a low resistivity may become worse by the above-described method. Recently, there is an art for attempting to improve the productivity by providing with a step for maturing the melt after melting the crystalline raw material to prevent unmelted remains of, for example, a crystalline raw material or dopant (See Patent Literatures 1 and 2).

When the crystal is pulled with DF (Dislocation Free) without the generation of dislocation, loss of time and product is small. The dislocation is practically generated with some frequency. Once the dislocation is generated, the dislocation is introduced into a dislocation free portion at approximately a length corresponding to the diameter thereof. The portion of the generated dislocation cannot be a product naturally. In the event that the length of the crystal portion that can be a product is short, the crystal is melted again. On the other hand, in the event that the length of the crystal portion that can be a product is equal to or more than a predetermined length, since product parts can be secured to a certain extent, it may be taken out, as it is, without remelting. In the former case, even if the crystal is pulled with dislocation free to the end after remelting, there occurs time loss of crystal manufacture time before the remelting plus remelting time plus re-decreasing temperature time, and productivity consequently becomes worse. In the latter case, the portion of the generated dislocation cannot be a product, and both of yield and productivity consequently become worse simply.

A value obtained by converting the frequency of conducting the remelting of the crystal into an average per one crystal is referred to as a remelting ratio. A value obtained by converting the number of the crystal pulled with DF to the end among all pulled crystals into a value per the whole number is defined as a DF ratio. Conventionally, in case of a small diameter (that is, the crucible also has a small diameter), the remelting ratio is low. On the other hand, in case of a large diameter (that is, the crucible also has a large diameter), the remelting ratio is high. The DF ratio in case of a large diameter also becomes worse in comparison with that in the case of a small diameter.

CITATION LIST

Patent Literature

Patent Literature 1: Japanese Unexamined Patent publication (Kokai) No. 2004-175620
Patent Literature 2: Japanese Unexamined Patent publication (Kokai) No. 2008-247737

SUMMARY OF INVENTION

Technical Problem

The remelting ratio and DF ratio can be improved to a certain degree by carrying out the maturing prior to the growth of the single crystal, like Patent Literature 1. There is however plenty of room for improvement. In addition, the quality and yield of the single crystal may be deteriorated due to variations in time, a crucible position, heater power, and the like.

The present invention was accomplished in view of the above-explained problems, and its object is to provide a single-crystal manufacturing method that enables the generation of dislocation to be effectively suppressed and a high quality single crystal to be manufactured at good yield, particularly in case of pulling the single crystal having a large diameter, in manufacture of the single crystal.

Solution to Problem

To achieve this object, the present invention provides a single-crystal manufacturing method based on the Czochralski method, comprising at least the steps of: producing a melt by heating and melting a crystalline raw material in a crucible with a heater; maturing the melt by keeping the melt at a high temperature; and growing a single crystal after dipping a seed crystal into the matured melt, wherein the heater and the crucible are relatively moved up and down in the step of maturing.

In this manner, when the melt is matured by keeping the melt at a high temperature, dopant, etc. can be sufficiently melted into the melt. In addition, when the heater and the crucible are relatively moved up and down during the maturing, the whole melt in the crucible can be heated all over, and thereby the unmelted remains of dopant, etc. in the melt, particularly in the crucible having a large diameter, can be effectively melted. Furthermore, a local change in quality of the surface of the crucible due to heat of the heater can be uniformed by the relative up and down movement, and thereby a part of a surface or an oxide attached to the surface can be prevented from falling off the crucible surface, without excessive deterioration of the local part of the crucible surface. In addition, even when an oxide in a furnace falls into the melt, it can be sufficiently melted into the melt by the uniform heating.

As described above, with the single-crystal manufacturing method according to the present invention, the unmelted remains of dopant, etc. in the melt and an oxide, etc. falling off the crucible surface can be effectively suppressed in the step of maturing, and thereby the single crystal can be manufactured at good yield while the generation of dislocation is prevented.

In this case, it is preferable that heater power at the start of the step of maturing is higher than that at the start of the step of growing the single crystal and is equal to or lower than that of the step of producing the melt, and the heater power at the end of the step of maturing is lower than that of the step of producing the melt and is equal to or higher than that at the start of the step of growing the single crystal.

The above-described heater power enables the melt to be efficiently prevented from becoming solid during the maturing without excessive heater power. The above-described range of the heater power enables the up and down movement of the heater to be carried out more safely.

In this case, in the step of maturing, the melt is preferably matured for 2 hours or more.

In this manner, when the melt is matured for 2 hours or more, the unmelted remains in the melt can be sufficiently melted even in the case of introducing a large amount of insoluble dopants.

In this case, in the step of maturing, the heater and the crucible preferably are relatively moved up and down at a speed of 2 mm/min or less.

The above-described speed enables the up and down movement to be carried out more safely during heating by the heater.

In this case, in the step of maturing, the heater and the crucible preferably are relatively moved up and down with a width of 10 cm or more.

When it is moved up and down with the above-described width, the crucible and the melt are heated more uniformly, and thereby the unmelted remains in the melt can be reduced. In addition to these, the deterioration of the local part of the crucible surface is suppressed, and thereby the generation of dislocation can be more effectively prevented during pulling the single crystal in a subsequent step.

In this case, in the step of maturing, the heater and the crucible preferably are relatively moved up and down so that a lower limit position of movement of a lower end of a heater slit of the heater is below a position of 5 cm higher than a lowermost end of the melt in the crucible.

When they are moved up and down in the above-described manner, the crucible and melt can be heated uniformly up to the bottom, and the generation of dislocation can be more effectively prevented.

In this case, in the step of maturing, a magnetic field is preferably applied to the melt in the crucible.

In this manner, when the magnetic field is applied to the melt in the step of maturing, the generation of dislocation can be more effectively suppressed during pulling the single crystal in a subsequent step.

In this case, in the step of maturing, final positions of the heater and the crucible in the step maturing are preferably adjusted to the same as a crystal growth start position in the step of growing the single crystal, and the heater power is preferably adjusted to the same as that at the start of the growing, by means of automatically adjusting the relative up and down movement of the heater and the crucible and/or the heater power.

In this manner, when the movement position of the crucible and heater and the heater power are adjusted during the maturing in such a manner that, at the end of the step of maturing, they become the crystal growth start position and crystal growth start temperature in the step of growing the single crystal respectively, the state of the melt and heater can smoothly make the transition from the step of maturing to the step of growing, and productivity can be thereby improved. In addition, when the adjustment of the movement and heater power is carried out automatically, there arises little difference between manufacture conditions and actual values of crucible position, temperature, and the like, there is no variation of quality, and consequently a high quality single crystal can be more surely manufactured.

In this case, when the diameter of the crucible is 32 inches (81 cm) or more, the present invention is greatly effective against productivity.

The crucible having a relatively large diameter as above leaves a large amount of unmelted remains in the melt, and is easy to generate the deterioration of the local part of the crucible surface. The manufacturing method according to the present invention is favorably applied to the above-described crucible.

Advantageous Effects of Invention

As described above, with the single-crystal manufacturing method according to the present invention, the unmelted remains of dopant, etc. in the melt can be reduced, an oxide, etc. falling off the crucible surface can be suppressed, in the step of the maturing, and thereby the single crystal can be manufactured at good yield while the generation of dislocation is effectively prevented.

DESCRIPTION OF EMBODIMENTS

There has been a problem that the yield of the single crystal manufacture becomes worse due to the generation of dislocation to the pulled crystal, particularly during manufacture of the single crystal having a large diameter.

The present inventors repeatedly keenly conducted studies on this problem. As a result, the present inventors found the following.

The present inventors found that the causes of the generation of dislocation are "(1) the generation of dislocation due to attachment of the unmelted remains of the raw material in the melt to the crystal", "(2) the generation of dislocation due to attachment of the unmelted remains of oxide that fell into the melt to the crystal", "(3) the generation of dislocation due to attachment of substances that fall off the surface of the crucible having a bad surface state to the crystal", and the like. From this findings by the present inventors, they attempted to provide with the step of maturing the melt between the steps from the end of melting the crystalline raw material to decreasing the temperature, and to relatively move up and down the heater and the crucible at the step.

As a result, the present inventors conceived that the unmelted remains are more effectively melted, and the change in quality of the crucible surface is made to be more uniform all over, by a way of heating all over in comparison with a way of heating in a manner of concentrating on one place, and consequently conceived that both of the remelting ratio and DF ratio can be more improved by maturing in a manner of moving the heater up and down, in comparison with maturing it for the same time in a manner of fixing the positions of the heater and the crucible. The present inventors thereby brought the present invention to completion.

Hereinafter, an example of embodiment of the single-crystal manufacturing method according to the present invention will be explained in detail with reference to the drawings, but the present invention is not restricted thereto.

Figure 1:
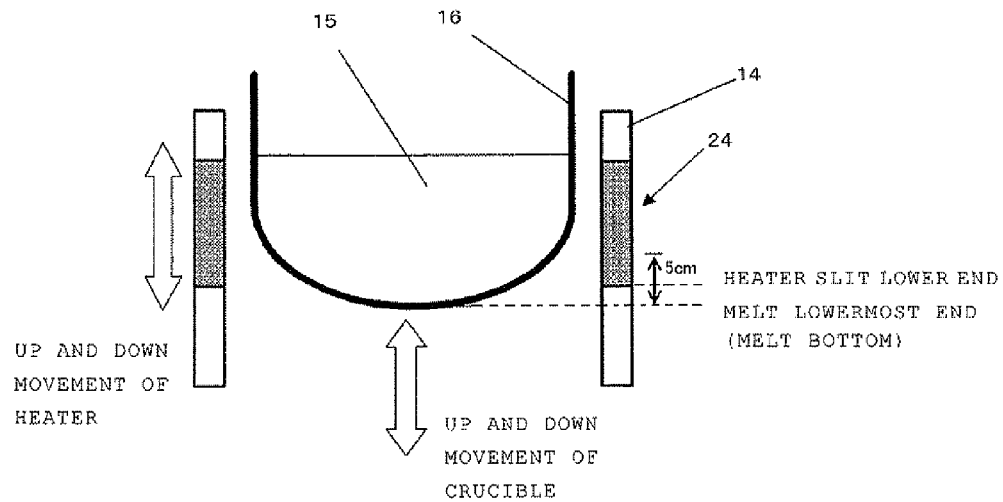
FIG. 1 is an explanatory view to explain the single-crystal manufacturing method according to the present invention.
Figure 2:
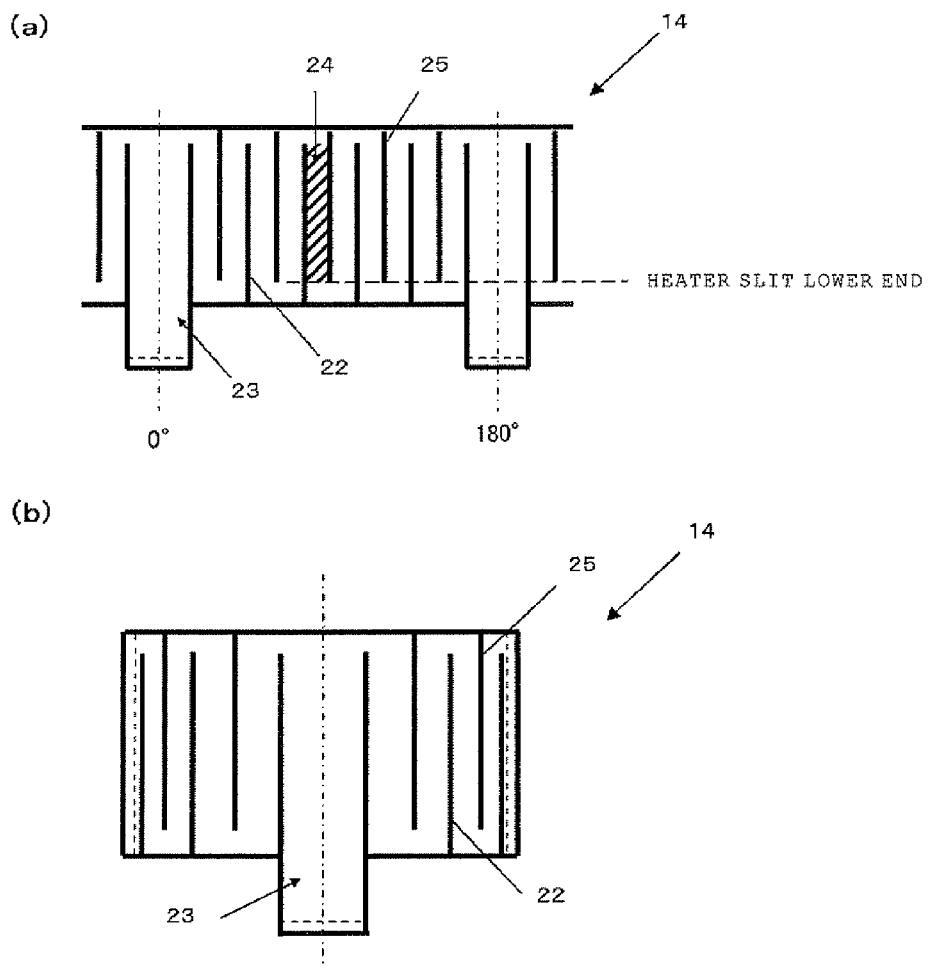
FIG. 2 are (a) a development view and (b) a side view of the heater of a single-crystal manufacturing apparatus that can be used for the single-crystal manufacturing method according to the present invention.
Figure 3:
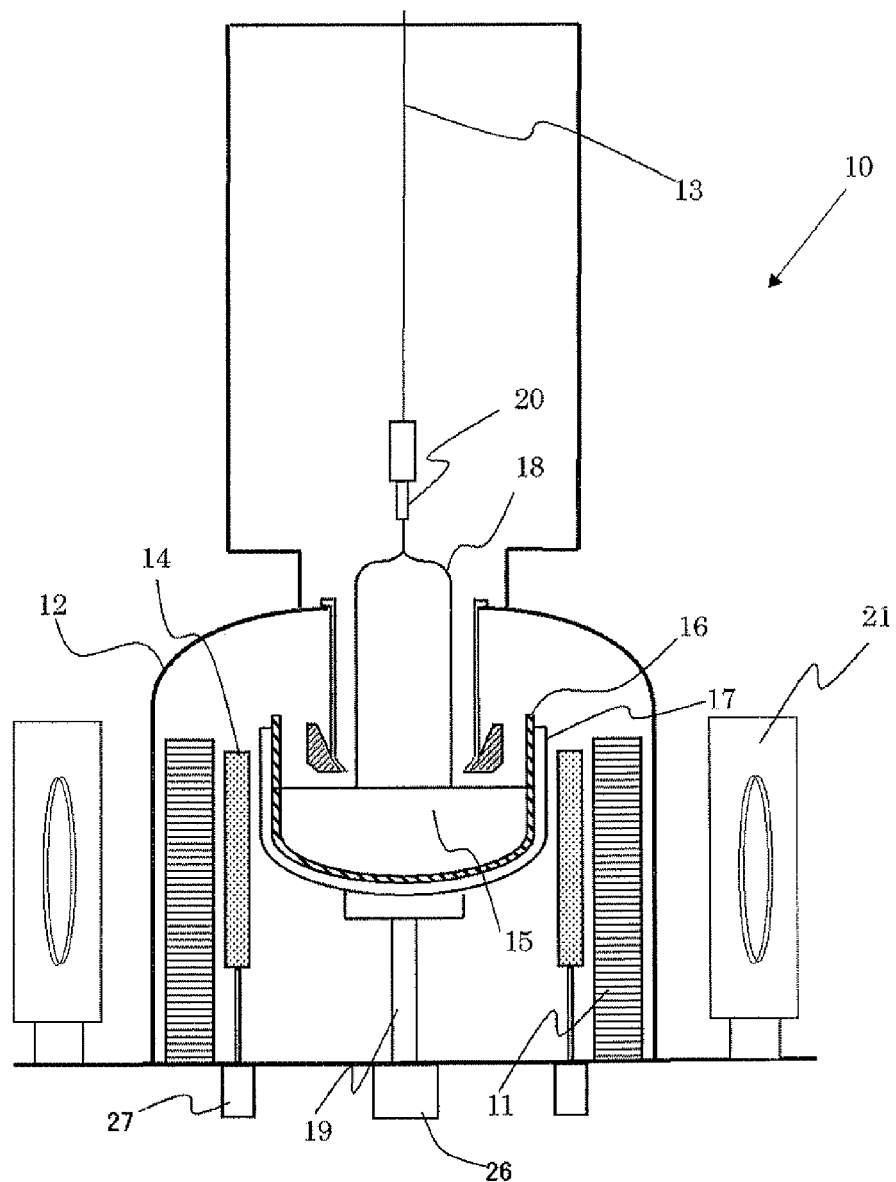
FIG. 3 is a schematic view showing an example of a single-crystal manufacturing apparatus that can be used for the single-crystal manufacturing method according to the present invention.

FIG. 1 is an explanatory view to explain the single-crystal manufacturing method according to the present invention. FIG. 2 are (a) a development view and (b) a side view of the heater of a single-crystal manufacturing apparatus that can be used for the single-crystal manufacturing method according to the present invention. FIG. 3 is a schematic view showing an example of a single-crystal manufacturing apparatus that can be used for the single-crystal manufacturing method according to the present invention.

An apparatus for carrying out the single-crystal manufacturing method according to the present invention is not restricted in particular, and a common apparatus can be used. For example, a single-crystal manufacturing apparatus shown in FIG. 3 can be used.

The single-crystal manufacturing apparatus 10 shown in FIG. 3 is provided with a quartz crucible 16 for containing the melt 15 obtained by melting a crystalline raw material, and a graphite crucible 17 for supporting the quartz crucible 16 inside a main chamber 12. These crucibles 16 and 17 are supported with a shaft 19 in such a manner that they are rotatable and movable upwardly and downwardly by a driving mechanism 26. The driving mechanism 26 of the crucibles 16 and 17 moves upwardly the crucibles 16 and 17 for a distance corresponding to an amount of decrease in a melt surface during the growth of the single crystal in order to compensate the decrease in the melt surface of the melt 15, followed by pulling the single crystal 18. A pulling wire 13 is arranged concentrically with a central axis of the crucibles 16 and 17. A seed crystal 20 is held at a lower end of the pulling wire 13. The single crystal 18 is formed at a lower end face of the seed crystal 20.

Magnetic field applying devices 21 are arranged, outside a main chamber 12, with putting the crucibles 16 and 17 between them and concentrically facing to the crucibles 16 and 17 so as to apply a horizontal magnetic field to the melt 15. The heater 14 for heating and melting a raw material is arranged so as to surround the crucibles 16 and 17. A heat-insulating member 11 for preventing the main chamber 12 from being directly exposed to heat from the heater 14 is provided outside the heater 14 so as to surround the perimeter of the heater.

Here, as a commonly used heater 14, FIG. 2 show (a) a development view and (b) a side view of the graphite heater. The graphite heater 14 is a cylindrical shape, and mainly composed of isotropic graphite. In case of a direct-current type, the graphite heater 14 has two terminals 23 and is configured to be supported by the terminals 23. For purpose of efficiently generating heat, the graphite heater 14 has two types of heater slits 25 and 22 of upper heater slits 25 extending downwardly from the upper end and lower heater slits 22 extending upwardly from the lower end, formed thereon, and the heater slits are formed at several points to some dozen points. The above-described graphite heater 14 mainly generates heat particularly from each heat-generating slit portion 24 that is located between the lower end of each upper heater slit 25 and the upper end of each lower heater slit.

Particularly, as an apparatus used for the manufacturing method according to the present invention, a heater driving mechanism 27 is preferably installed so that the heater 14 is movable up and down while heating.

In the single-crystal manufacturing method according to the present invention, first, a crystalline raw material is introduced into the quartz crucible 16 of the above-described single-crystal manufacturing apparatus 10, and thereafter heated and melted by the heater 14 to produce the melt 15.

In this step, the crystalline raw material, such as a silicon polycrystal, and a dopant are charged into the crucible to melt. In this case, while the melt and the crystalline raw material are intermingled, the temperature of the melt in the quartz crucible is a melting point of the crystalline raw material. In order to keep high productivity, it is important for the temperature to reach, for short time, a desired temperature to be maintained in a next process by rapidly carrying out the operation of a decrease in heater power after melting the crystalline raw material completely.

Moreover, as the dopant that is added and melted together with the crystalline raw material, there is exemplified a dopant that gives conductivity to the single crystal, such as boron, and a dopant that suppresses crystal defects, such as nitrogen and carbon. One of these dopants or a mixture thereof are melted together with the crystalline raw material. These dopants may be added after melting the crystalline raw material. In this case, even when all the raw material in the crucible seems to be melted visually, an unseen fine unmelted material is free on the surface of the melt, or the unmelted raw material is attached to a crucible inner wall (particularly a bottom portion) in the melt. These cause the generation of dislocation in a subsequent growing step of the single crystal. In the present invention, the step of maturing is accordingly performed as follows.

It is to be noted that when the diameter of the crucible 16 to be used is 32 inches (81 cm) or more, the present invention is greatly effective against productivity.

The crucible having a relatively large diameter as above leaves a large amount of unmelted remains in the melt, and is easy to generate the deterioration of the local part of the crucible surface. The manufacturing method according to the present invention is favorably applied to the above-described crucible.

Moreover, when a low resistivity crystal is manufactured by adding a large amount of dopant, the manufacturing method according to the present invention is favorably applied which can reduce the unmelted remains in the melt.

Next, in the manufacturing method according to the present invention, the melt 15 obtained by melting the crystalline raw material is matured by keeping the melt at a high temperature. In this step, as shown in FIG. 1, the heater 14 and the crucibles 16 and 17 are relatively moved up and down.

As described above, when the melt is matured by keeping the melt at a high temperature, the unmelted raw material, dopant and the like are melted into the melt to a certain degree. In case of maturing it with the heater and the crucibles fixed like a conventional method, however, the same parts are heated for long time with the same heating distribution, and thereby heated parts and relatively low temperature parts are locally divided. There consequently arise problems that the unmelted raw material, dopant and the like are partly insufficiently melted, and that the crucible is deteriorated at the local heated parts. On the other hand, in the manufacturing method according to the present invention, the whole melt in the crucible can be heated all over by relatively moving the heater and crucible up and down during the maturing, and thereby the unmelted remains of dopant, etc. in the melt, particularly in the crucible having a large diameter, can be more effectively melted. Furthermore, a local change in quality of the crucible surface due to heat of the heater can be uniformed by the relative up and down movement, and thereby a part of the surface and the oxide attached to the surface can be prevented from falling off the crucible surface, without excessive deterioration of the local part of the crucible surface. In addition, even when an oxide in a furnace falls into the melt, it can be sufficiently melted into the melt by the uniform heating. As described above, the present invention can solve the local temperature distribution and thereby the unmelted remains problem, by means of relatively moving the heater and crucible.

In this case, this is relative up and down movement, and therefore either the crucibles 16 and 17 or the heater 14 may be moved up and down. Alternatively, Both of the crucibles 16 and 17, and the heater 14 may be moved up and down in an opposite direction to one another. However, it is preferable that only the heater 14 is moved up and down.

Moving up and down only the heater 14 is easier to be carried out than moving up and down the crucible containing the melt, and to finely adjust the width of the up and down movement.

Moreover, the relative up and down movement may be continued during the step of maturing or carried out periodically. The effect of the present invention can be exerted by moving up and down at least once during the step of maturing.

In this case, heater power at the step of maturing is not restricted in particular as long as the surface of the melt 15 does not become solid. It is preferably lower than that of the step of producing the melt 15, and is higher than that at the start of the next step of growing the single crystal 18.

The above-described heater power enables the melt to be efficiently prevented from becoming solid during the maturing without excessive heater power. The above-described range of the heater power enables the up and down movement of the heater to be carried out more safely, and an increase in cost to be suppressed.

In this case, the time for which the melt 15 is kept at a high temperature is not restricted in particular. For example, the melt is preferably matured by keeping it at a high temperature for 2 hours or more.

As described above, when the melt is kept at a high temperature for 2 hours or more, the unmelted remains in the melt can be sufficiently melted even in the case of introducing a large amount of insoluble dopants. In addition, as the maturing time is longer, the unmelted remains are more reduced, and thereby the productivity becomes better. When the maturing time is so long, however, the whole operation time becomes long. Therefore, considering the time required for remelting, the remelting ratio and the like, the upper limit of the maturing time is preferably 10 hours.

In this case, in the step of maturing, the heater 14 and the crucibles 16 and 17 preferably are relatively moved up and down at a speed of 2 mm/min or less.

The above-described speed enables the up and down movement to be carried out more safely during heating by the heater.

In this case, in the step of maturing, the heater 14 and the crucibles 16 and 17 preferably are relatively moved up and down with a width of 10 cm or more, and more preferably 15 cm or more.

When it is moved up and down with the above-described width, the crucible and the melt are heated more uniformly, and thereby the unmelted remains in the melt can be reduced. In addition to these, the deterioration of the local part of the crucible surface is suppressed, and the generation of dislocation can be more effectively prevented during pulling the single crystal in a subsequent step.

In this case, as shown in FIG. 1, in the step of maturing, the heater 14 and the crucibles 16 and 17 preferably are relatively moved up and down so that the lower limit position of movement of the lower end of each heater slit 25 of the heater 14 is below a position of 5 cm higher than the lowermost end (a melt bottom) of the melt 15 in the crucibles 16 and 17.

When it is moved up and down in the above-described manner, the crucible and melt can be heated uniformly up to below, and the generation of dislocation can be more effectively prevented in a subsequent step.

In this case, in the step of maturing, a magnetic field is preferably applied to the melt in the crucibles 16 and 17 with the magnetic field applying device 21.

The magnetic field is thereby applied to the melt during the maturing, and the generation of dislocation can be more suppressed during pulling the single crystal in a subsequent step. It is assumed that the crucible surface is improved due to crystallization, which is caused by applying the magnetic field, and the improvement is exerted all over by the relative movement of the heater and crucible.

In this case, in the step of maturing, final positions of the heater 14 and the crucibles 16 and 17 in the step of maturing are preferably adjusted to the same as the crystal growth start position in the step of growing the single crystal 18, and the heater power is adjusted to the same as that at the start of the growing, by means of automatically adjusting the relative up and down movement of the heater 14 and the crucibles 16 and 17 and/or the heater power.

In this manner, when the movement position of the crucible and heater and the heater power are adjusted during the maturing in such a manner that, at the end of the step of maturing, they become the crystal growth start position and crystal growth start temperature in the step of growing the single crystal respectively, the state of the melt and heater can smoothly make the transition from the step of maturing to the step of growing the single crystal, and productivity can be thereby more improved. In addition, when the adjustment of the movement and heater power from the start of the maturing to the end thereof is carried out automatically, the maturing can be carried out in the same conditions every time, the single crystal can be manufactured without the variation of the operability, and a workload is also reduced.

Next, the seed crystal 20 is dipped into the matured melt 15 and pulled with the pulling wire 13. The single crystal 18 is thereby grown.

In this case, following the step of maturing, the MCZ method (Magnetic field applied CZ method) can be used in which the single crystal is pulled while the magnetic field is applied to control the convection of the melt.

As described above, with the single-crystal manufacturing method according to the present invention, the unmelted remains of raw material and dopant, etc. in the melt and an oxide, etc. falling off the crucible surface can be effectively suppressed in the step of maturing, and thereby the single crystal can be manufactured at good yield while the generation of dislocation is prevented.

EXAMPLE

Hereinafter, the present invention will be explained in more detail with reference to Examples and Comparative Examples, but the present invention is not restricted thereto.

Example 1

A single crystal ingot having a diameter of 300 mm was manufactured by using the crucible having a diameter of 32 inches (81 cm). First, primary melt of the crystalline raw material was carried out. The temperature (the heater power) was not decreased immediately thereafter, but the step for maturing the melt by keeping it for 2 hours was provided after the heater power was once adjusted to just the middle between the heater power at the time of melting and the heater power at the start of the crystal growth. The temperature was thereafter decreased to an appropriate temperature for the start of the crystal growth, and the single crystal was grown.

The heater was moved up and down with a width of 12 cm at a speed of 2 mm/min during the step of maturing for 2 hours (up movement of 12 cm, down movement of 12 cm). Here, the lower limit position of movement of the lower end of each heater slit was a position of 3 cm higher than the melt bottom (the lowermost end of the melt).

At this point in time, the heater power at the time of melting was 200 kW, the heater power at the start of the crystal growth was 150 kW, and the heater power at the time of maturing was 175 kW. With regard to a positional relationship at the start of the crystal growth just after the end of the maturing step, "the distance between the lower end of each heater slit and the melt bottom" was 150 mm.

In case of pulling 30 ingots in the above conditions, the remelting ratio was 0.3, and the DF ratio was 80%.

Example 2

Next, a single crystal was manufactured in the same conditions of the heater power and the like as Example 1 except that the width of the up and down movement and the position of the heater and crucible during the maturing step were changed.

In the maturing step, the heater was first moved down so that the position of the lower end of the heater slit was equal to the position of the melt bottom, and moved up by 15 cm during the maturing for 2 hours. The final positions of the crucible and heater were adjusted to the same as the start conditions of the single crystal growth (the same as Example 1). These were automatically carried out.

In case of pulling 30 ingots in the above conditions, the remelting ratio was 0.29, and the DF ratio was 80%. These were approximately the same as Example 1, and an operator did not need to move the heater manually due to the automatic operation. The productivity was improved at the same level as Example 1.

Example 3

Further, a single crystal was manufactured in the same conditions of the heater power and the like as Example 1 except that the width of the up and down movement and the position of the heater and crucible during the maturing step were changed.

In the maturing step, the heater was first moved down so that the position of the lower end of the heater slit was equal to a position of 10 cm higher than the melt bottom, and moved up by 5 cm during the maturing for 2 hours. The final positions of the crucible and heater were adjusted to the same as the start conditions of the crystal growth (the same as Example 1). These were automatically carried out.

In case of pulling 30 ingots in the above conditions, the remelting ratio was 0.5, and the DF ratio was 77%. The result did not reach the same level as Example 1 and 2, although it was more improved in comparison with the case without the movement. As described above, it can be considered that the width of the up and down movement is desirably 10 cm or more, and the distance between the lower end of the heater slit and the melt bottom is desirably adjusted to 5 cm or less once.

Comparative Example 1

A crystal ingot having a diameter of 300 mm was manufactured by using the crucible having a diameter of 32 inches (81 cm). First, primary melt of the crystalline raw material was carried out. The temperature (the heater power) was immediately thereafter decreased to an appropriate temperature for the start of the crystal growth, and the crystal was grown.

At this point in time, the heater power at the time of melting was 200 kW, the heater power at the start of the crystal growth was 150 kW. With regard to a positional relationship at the start of the crystal growth, "the distance between the lower end of each heater slit and the melt bottom" was 150 mm. The time required from the end of melting to the start of the crystal growth was approximately 30 minutes including the time required for stabilizing the temperature.

In case of pulling 30 ingots in the above conditions, the remelting ratio was 1.2, and the DF ratio was 70%.

Comparative Example 2

The temperature was decreased to an appropriate temperature for the start of the crystal growth after maturing and the crystal growth was carried out in the same conditions as Comparative Example 1 except that the temperature (the heater power) was not decreased immediately after primary melt of the crystalline raw material was carried out, but the step for maturing the melt by keeping it for 2 hours was provided after the heater power was adjusted to just the middle between the heater power at the time of melting and the heater power at the start of the crystal growth. The crucible and heater were kept a fixed state in the maturing step.

In case of pulling 30 ingots in the above conditions, the remelting ratio was 0.8, and the DF ratio was 70%.

As described above, it was revealed that the remelting ratio was halved and the DE ratio was improved by approximately 10% in comparison with a conventional method, by means of providing with the step of maturing and relatively moving the crucible and heater up and down in the step, like Examples 1 to 3. It is to be noted that only the heater was moved up and down in the above-described Examples, but the same results were obtained in case of moving only the crucible up and down and in case of moving both of the crucible and heater up and down.

It is to be noted that the present invention is not restricted to the foregoing embodiment. The embodiment is just an exemplification, and any examples that have substantially the same feature and demonstrate the same functions and effects as those in the technical concept described in claims of the present invention are included in the technical scope of the present invention.

The invention claim is:

1. A single-crystal manufacturing method based on the Czochralski method, comprising at least the steps of:
    producing a melt by heating and melting a crystalline raw material in a crucible with a heater;
    maturing the melt by keeping the melt at a high temperature; and
    growing a single crystal after dipping a seed crystal into the matured melt,
    wherein
    the heater and the crucible are relatively moved up and down in the step of maturing, and
    heater power at the start of the step of maturing is higher than that at the start of the step of growing the single crystal and is equal to or lower than that of the step of producing the melt, and the heater power at the end of the step of maturing is lower than that of the step of producing the melt and is equal to or higher than that at the start of the step of growing the single crystal.

2. The single-crystal manufacturing method according to claim 1, wherein, in the step of maturing, the melt is matured for 2 hours or more.

3. The single-crystal manufacturing method according to claim 2, wherein, in the step of maturing, the heater and the crucible are relatively moved up and down at a speed of 2 mm/min or less.

4. The single-crystal manufacturing method according to claim 3, wherein, in the step of maturing, the heater and the crucible are relatively moved up and down with a width of 10 cm or more.

5. The single-crystal manufacturing method according to claim 2, wherein, in the step of maturing, the heater and the crucible are relatively moved up and down with a width of 10 cm or more.

6. The single-crystal manufacturing method according to claim 1, wherein, in the step of maturing, the heater and the crucible are relatively moved up and down at a speed of 2 mm/min or less.

7. The single-crystal manufacturing method according to claim 6, wherein, in the step of maturing, the heater and the crucible are relatively moved up and down with a width of 10 cm or more.

8. The single-crystal manufacturing method according to claim 1, wherein, in the step of maturing, the heater and the crucible are relatively moved up and down with a width of 10 cm or more.

9. The single-crystal manufacturing method according to claim 1 wherein, in the step of maturing, the heater and the crucible are relatively moved up and down so that a lower limit position of movement of a lower end of each heater slit of the heater is below a position of 5 cm higher than a lowermost end of the melt in the crucible.

10. The single-crystal manufacturing method according to claim 1 wherein, in the step of maturing, a magnetic field is applied to the melt in the crucible.

11. The single-crystal manufacturing method according to claim 1 wherein, in the step of maturing, final positions of the heater and the crucible in the step of maturing are adjusted to the same as a crystal growth start position in the step of growing the single crystal, and the heater power is adjusted to the same as that at the start of the growing, by means of automatically adjusting the relative up and down movement of the heater and the crucible and/or the heater power.

12. The single-crystal manufacturing method according to claim 1, wherein a diameter of the crucible is 32 inches (81 cm) or more.

* * * * *